United States Patent
Lee et al.

(10) Patent No.: US 8,258,523 B2
(45) Date of Patent: Sep. 4, 2012

(54) DISPLAY DEVICE AND ORGANIC LIGHT EMITTING DIODE DISPLAY

(75) Inventors: Hae-Yeon Lee, Yongin (KR); Chun-Seok Ko, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 13/097,259

(22) Filed: Apr. 29, 2011

(65) Prior Publication Data

US 2012/0025229 A1 Feb. 2, 2012

(30) Foreign Application Priority Data

Jul. 29, 2010 (KR) .................. 10-2010-0073512

(51) Int. Cl.
*H01L 29/18* (2006.01)
*H01L 33/00* (2010.01)
*H01L 51/00* (2006.01)

(52) U.S. Cl. .................. 257/91; 257/88; 257/E51.019; 257/E33.066

(58) Field of Classification Search .................. 257/88, 257/91, E51.019, E33.066
See application file for complete search history.

(56) References Cited

U.S. PATENT DOCUMENTS

| 7,709,337 | B2 * | 5/2010 | Jinbo et al. ................ 438/311 |
| 2004/0211966 | A1 * | 10/2004 | Guenther et al. ........... 257/79 |
| 2006/0163743 | A1 * | 7/2006 | Kuwabara et al. .......... 257/773 |
| 2010/0327737 | A1 * | 12/2010 | Hayashi et al. ........... 313/504 |

FOREIGN PATENT DOCUMENTS

| JP | 2001052858 | 2/2001 |
| JP | 2003092192 | 3/2003 |
| JP | 2008166181 | 7/2008 |
| KR | 1020030083528 A | 10/2003 |
| KR | 102010011102 A | 2/2010 |

* cited by examiner

*Primary Examiner* — Luan C Thai
(74) *Attorney, Agent, or Firm* — Robert E. Bushnell, Esq.

(57) ABSTRACT

A display device fabricated with a substrate; a display unit disposed on the substrate and including an electrode; a conductive protruding portion disposed along an outer side of the display unit and electrically connected to the electrode; a sealing substrate fixed to the substrate by an adhering layer surrounding substrate at the display unit and the conductive protruding portion, the adhering layer including a resin and a plurality of carbon fibers impregnated with the resin, and the sealing substrate including a through hole; a metal layer disposed at one side of the sealing substrate, facing the substrate, and contacting the conductive protruding portion electrically connected with the electrode; and a conductive connection portion filling the through hole and contacting the metal layer.

25 Claims, 12 Drawing Sheets

DISPLAY DEVICE AND ORGANIC LIGHT EMITTING DIODE DISPLAY

CLAIM OF PRIORITY

This application makes reference to, incorporates the same herein, and claims all benefits accruing under 35 U.S.C. §119 from an application for DISPLAY DEVICE AND ORGANIC LIGHT EMITTING DIODE DISPLAY earlier filed in the Korean Intellectual Property Office on 29 Jul. 2010 and there duly assigned Korean Patent Application No. 10-2010-0073512.

BACKGROUND OF THE INVENTION

1. Field of the Invention

The described technology relates generally to a display device. More particularly, the described technology relates generally to an organic light emitting diode (OLED) display. In addition, the described technology relates generally to a sealing substrate that seals a display unit.

2. Description of the Related Art

A display device includes a self-emissive organic light emitting diode (OLED) display.

The OLED display device is provided with an organic light emitting element that emits light to display an image. Since a function of a display unit including a plurality of organic light emitting elements is deteriorated when being exposed to moisture and oxygen, a technique for sealing the display unit to prevent permeation of moisture and oxygen is required.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention relates to a display device that can improve a sealing function of a display unit and an organic light emitting diode (OLED) display.

According to another aspect of the present invention, the display device includes a substrate; a display unit formed on the substrate, and the display unit including an electrode; a conductive protruding portion disposed at an outer side of the display unit and electrically connected with the electrode; a sealing substrate fixed to the substrate by an adhering layer surrounding the display unit and the conductive protruding portion, including a plurality of carbon fibers forming a matrix impregnated with a resin, and forming a through hole; a metal layer disposed at one side of the sealing substrate, facing the substrate, and contacting the conductive protruding portion and thus electrically connected with the electrode; and a conductive connection portion filling the through hole and contacting the metal layer.

According to another aspect of the present invention, the plurality of carbon fibers may cross each other.

According to another aspect of the present invention, the sealing substrate may be formed of a plurality of layers, and each of the plurality of layers may include the resin and the plurality of carbon fibers arranged in a matrix. A plurality of carbon fibers arranged on at least one of the plurality of layers may cross another one of the layers.

According to another aspect of the present invention, the conductive protruding portion may be simultaneously formed when the display unit formed using the same material of the display unit. The display unit may include an organic light emitting element, and the electrode is a common power line.

According to another aspect of the present invention, the display unit may further include a common electrode including a plurality of protruding portions. The metal layer may be divided into a first meal layer attached to the conductive protruding portion and a second metal layer attached to the plurality of protruding portions.

According to another aspect of the present invention, an organic light emitting diode (OLED) display according to another exemplary embodiment includes a substrate; a display unit formed on the substrate and including a common power line and a common electrode; a sealing substrate fixed to the substrate by an adhering layer surrounding the display unit, including a resin and a plurality of carbon fibers, and forming a first through hole and a second through hole; a conductive protruding portion disposed at an outer side of the display unit and connected with the common power line; a first conductive portion formed over inner and outer sides of the sealing substrate through the first through hole, and attached to the conductive protruding portion to supply a first electric signal to the common power line; and a second conductive portion formed over the inner and outer sides of the sealing substrate through the second through hole, and attached to the common electrode to apply a second electric signal to the common electrode.

According to another aspect of the present invention, the OLED display device may further include a plurality of pads disposed at the outer side of the display unit and connected with the common power line. The conductive protruding portion may be disposed on the pads while contacting the pads.

According to another aspect of the present invention, the conductive protruding portion may include a first insulating portion partially covering the pads, a second insulating portion formed on the first insulating portion, and an access conductive layer formed on the first and second insulating portions, while contacting the pads.

According to another aspect of the present invention, the common electrode may include a plurality of protruding portions, and the second conductive portion may be attached to the plurality of protruding portions. The OLED display device may further include a plurality of spacers disposed at a lower portion of the common electrode. The plurality of protruding portions may be provided to correspond to the spacers.

According to another aspect of the present invention, the display unit may further include a pixel definition layer. The first insulating portion may be formed of the same material of the pixel definition layer and the second insulating layer may be formed of the same material of the spacer. The access conductive layer may be formed of the same material of the common electrode. The conductive protruding portion may be disposed at a predetermined distance from the common electrode on the display unit.

According to another aspect of the present invention, the OLED display device may further include an insulating layer formed on inner and outer sides of the sealing substrate and side walls of the first and second through holes. The first and second conductive portions may be disposed on the insulating layer.

According to another aspect of the present invention, the second conductive portion may include a second inner layer facing the display unit and larger than the display device in size. The first conductive portion may include a first inner layer disposed at an outer side of the second inner layer and contacting the sealing substrate.

According to another aspect of the present invention, the first inner layer and the second inner layer may be made of at least one of an aluminum layer, an aluminum alloy layer, a copper layer, and a copper alloy layer.

According to another aspect of the present invention, the first conductive portion may further include a first connection portion filled in the first through hole and a first outer layer disposed at the outer side of the sealing substrate. The second conductive portion may further include a second connection portion filled in the second through hole and a second outer layer disposed at the outer side of the sealing substrate. The second through hole and the second connection portion may be disposed at the outer side of the display unit.

According to another aspect of the present invention, the first outer layer may be disposed at four edges of the sealing substrate, and the second outer layer may be disposed in parallel with the first outer layer at the inner side of the first outer layer. The first outer layer may be thicker than the first inner layer, and the second outer layer may be thicker than the second inner layer.

According to another aspect of the present invention, the common power line may include a first common power line and a second common power line that cross each other. The first conductive portion may include a third conductive portion connected with an odd-numbered first common power line and an odd-numbered second common power line among the first and second common power lines to supply a third electric signal thereto, and a fourth conductive portion connected with an even-numbered common power line and an even-numbered second common power line to supply a fourth electric signal thereto.

According to another aspect of the present invention, the OLED display device may further include a first pad disposed at an outer side of the display unit and electrically connected an odd-numbered first common power line and an odd-numbered second common power line and a second pad electrically connected with an even-numbered first common power line and an even-numbered second common power line.

According to another aspect of the present invention, the conductive protruding portion may include a first conductive protruding portion disposed on the first pad while contacting the first pad and a second conductive protruding portion disposed on the second pad while contacting the second pad.

According to another aspect of the present invention, the third conductive portion may include a third inner layer attached to the first conductive protruding portion, and the fourth conductive portion may include a fourth inner layer attached to the second conductive protruding portion.

According to another aspect of the present invention, the OLED display device can enhance the sealing function of the display unit, can increase luminance uniformity of the screen even in a large-sized display unit, and can simplify the entire structure and manufacturing process of the OLED display device by reducing the number of parts. Further, the OLED display device is provided with the conductive protruding portion so that an additional process for forming a conductive adhering layer for connecting the first conductive portion and the common power line can be omitted.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
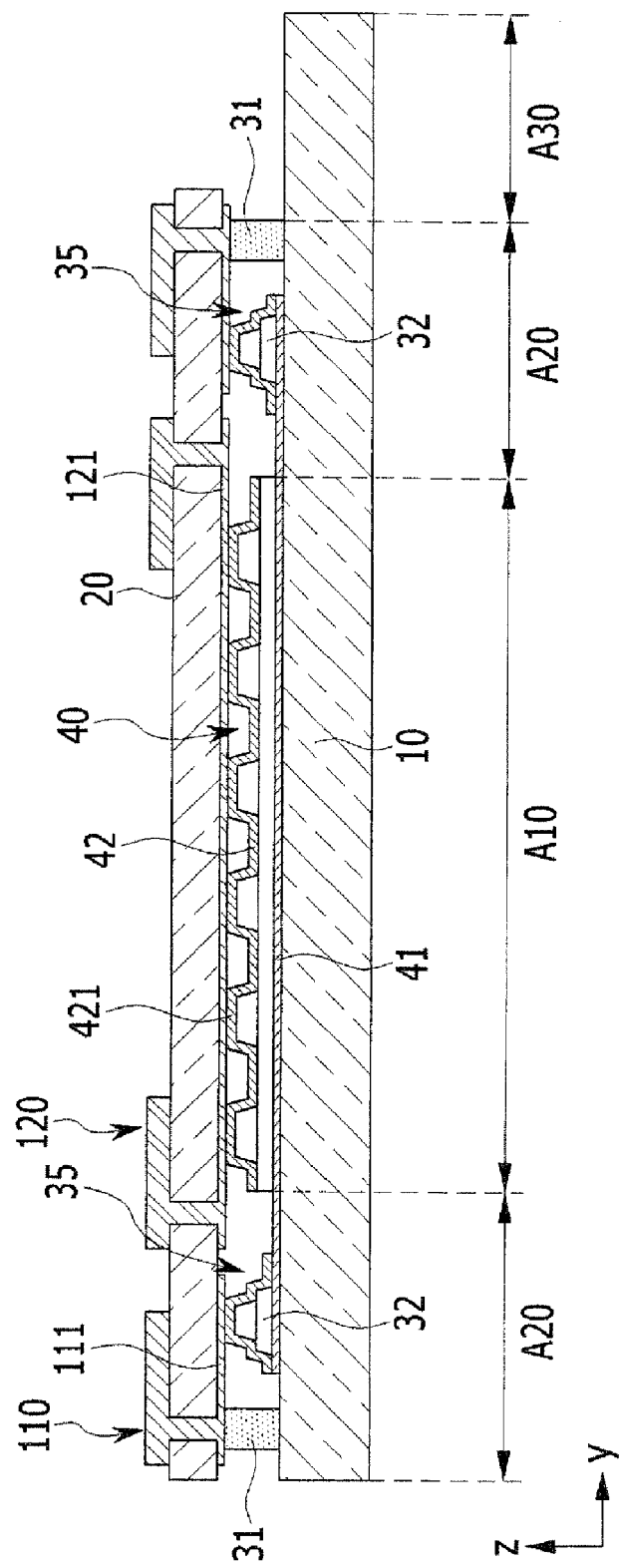
FIG. 1 is a schematic cross-sectional view of an organic light emitting diode (OLED) display according to an embodiment of the present invention.

The aspects of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of each component shown in the drawings are arbitrarily shown for understanding and ease of description, but the aspects of the present invention are not limited thereto.

Through the specification, it will be understood that when an element such as a layer, film, region, or substrate is referred to as being "on" another element, it can be directly on the other element or intervening elements may also be present.

FIG. 1 is a schematic top plan view of an organic light emitting diode (OLED) display according to an embodiment of the present invention. Referring to FIG. 1, an OLED display device 100 includes a substrate 10, a display unit 40 formed on the substrate 10, and a sealing substrate 20 adhered to the substrate 10 by an adhering layer 31 that surrounds the display unit 40. The substrate 10 includes a display area A10 where the display unit 40 is located and a non-display area disposed at the outer side of the display area A10. The non-display area may be divided into a wire and sealing area A20 and a pad area A30.

The display unit 40 includes a plurality of pixels, and each pixel includes an organic light emitting element and a driving circuit. The organic light emitting element includes a pixel electrode, an organic emission layer, and a common electrode 42. The driving circuit is formed of at least two thin film transistors including a switching thin film transistor and a driving thin film transistor and at least one capacitor.

In addition, each pixel includes a gate line, a data line, and a common power line 41. The gate line transmits a scan signal and the data line transmits a data signal. The common power line 41 applies a common voltage to the driving thin film transistor. The common power line 41 may be formed of two common power lines, that is, a first common power line and a second common power line formed along one direction or crossing each other.

A detailed structure of the display unit 40 will be described later, and FIG. 1 schematically illustrates the display unit 40 where the common power line 41 and the common electrode 42 are formed.

In the OLED display device 100, the common power line 41 and the common electrode 42 are not connected with a flexible printed circuit (not shown) attached to the pad area A30. The common power line 41 is connected with a first conductive portion 110 formed in the sealing substrate 20 and receives a first electric signal therefrom, and the common electrode 42 is connected with a second conductive portion 120 formed in the sealing substrate 20 and receives a second electric signal therefrom.

Figure 2:
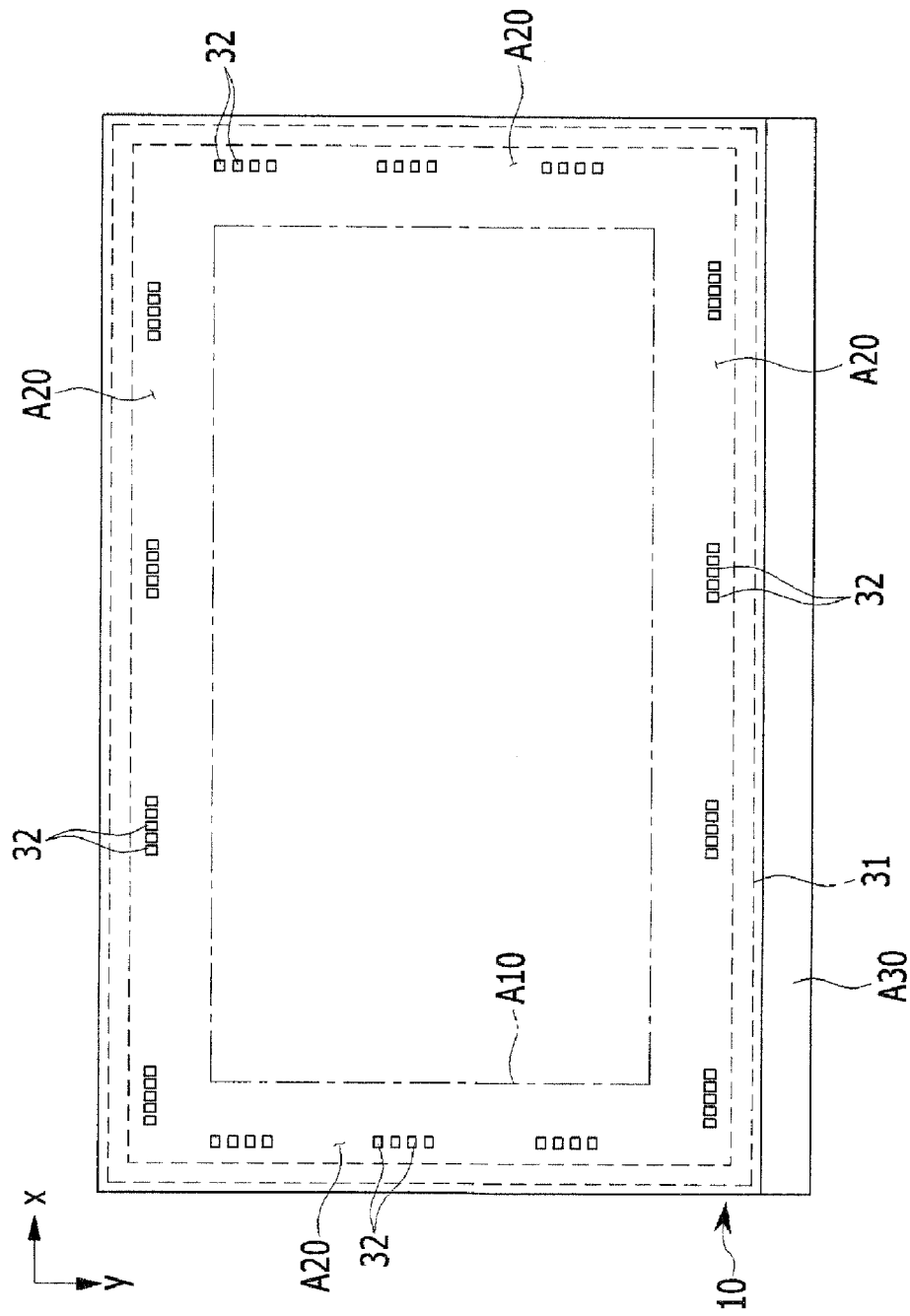
FIG. 2 is a top plan view of a substrate of the OLED display device of FIG. 1.

FIG. 2 is a top plan view of the substrate of the OLED display device of FIG. 1. Referring to FIG. 1 and FIG. 2, the substrate 10 is a rectangular shaped with a pair of long sides and a pair of short sides, and the wires and sealing areas A20 are located at the external sides of four edges of the display area A10. Adhering layers 31 are disposed at the edges of the wire and sealing areas A20. The adhering layer 31 may include a thermosetting resin, for example, an epoxy resin. A moisture absorbing filler (not shown) is formed between the substrate 10 and the sealing substrate 20 at an inner side of the adhering layer 31. In addition, the pad area A30 is disposed at one of the edges of the substrate 10 at an outer side of the wire and sealing area A20.

A plurality of pad units or pads 32 electrically connected with the common power line 41 of the display unit 40 are formed in all four of the wire and sealing areas A20. Among the plurality of pad units 32, a pad unit 32 located at a long side of the substrate 10 is connected with the first common power line and a pad unit 32 located at a short side of the substrate 10 is connected with the second common power line. The pad units 32 are disposed between the display unit 40 and the adhering layer 31.

FIG. 2 illustrates that the pad area A30 is located at a lower long side of the substrate 10, but the location of the pad area A30 is not limited thereto. In addition, FIG. 2 schematically illustrates a predetermined number of the pad units 32 arranged at a predetermined location. However, the location and the number of pad units 32 are not limited thereto.

Figure 3:
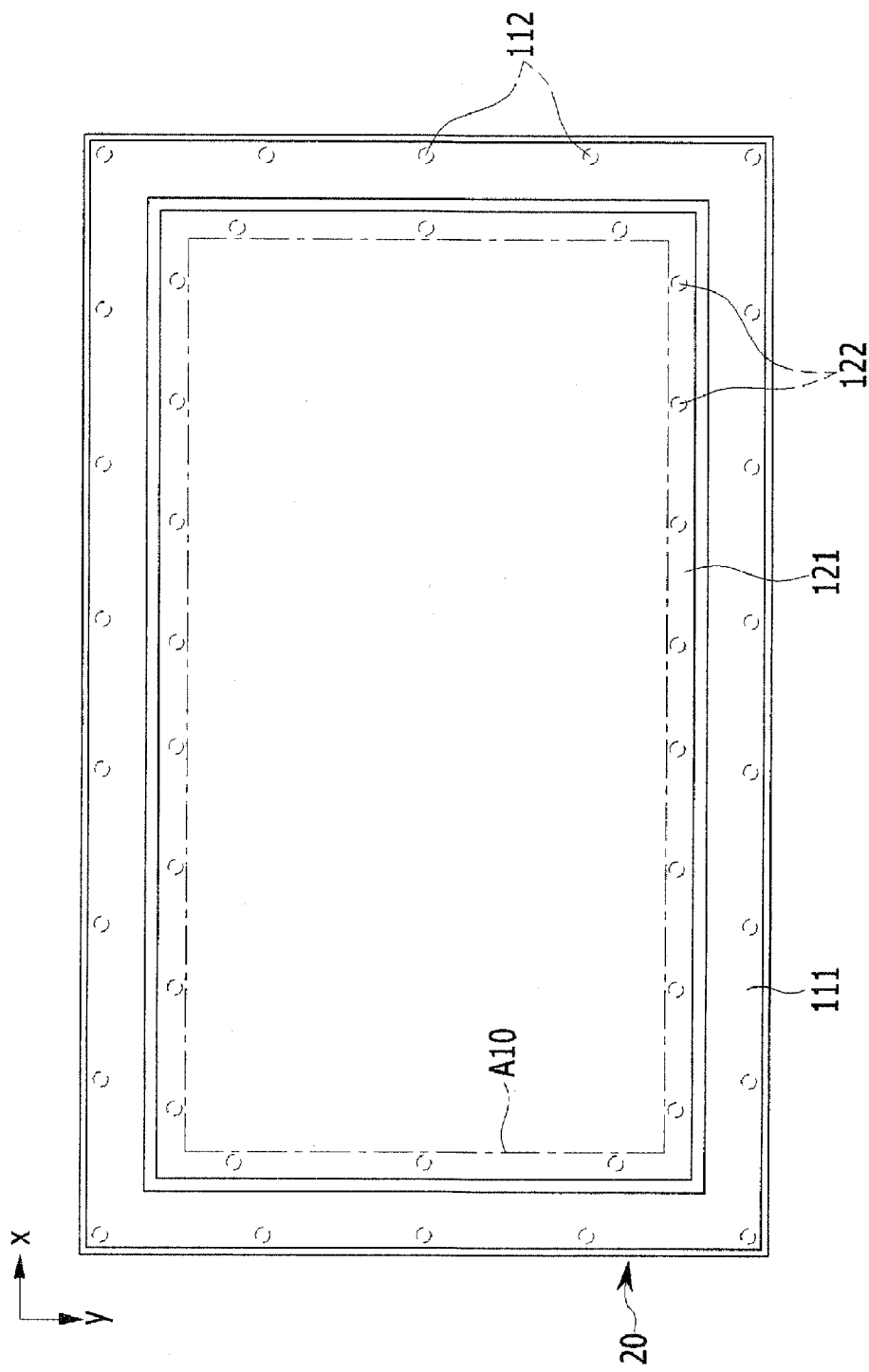
FIG. 3 is a top plan view of an inner side of a sealing substrate of the OLED display device of FIG. 1.
Figure 4:
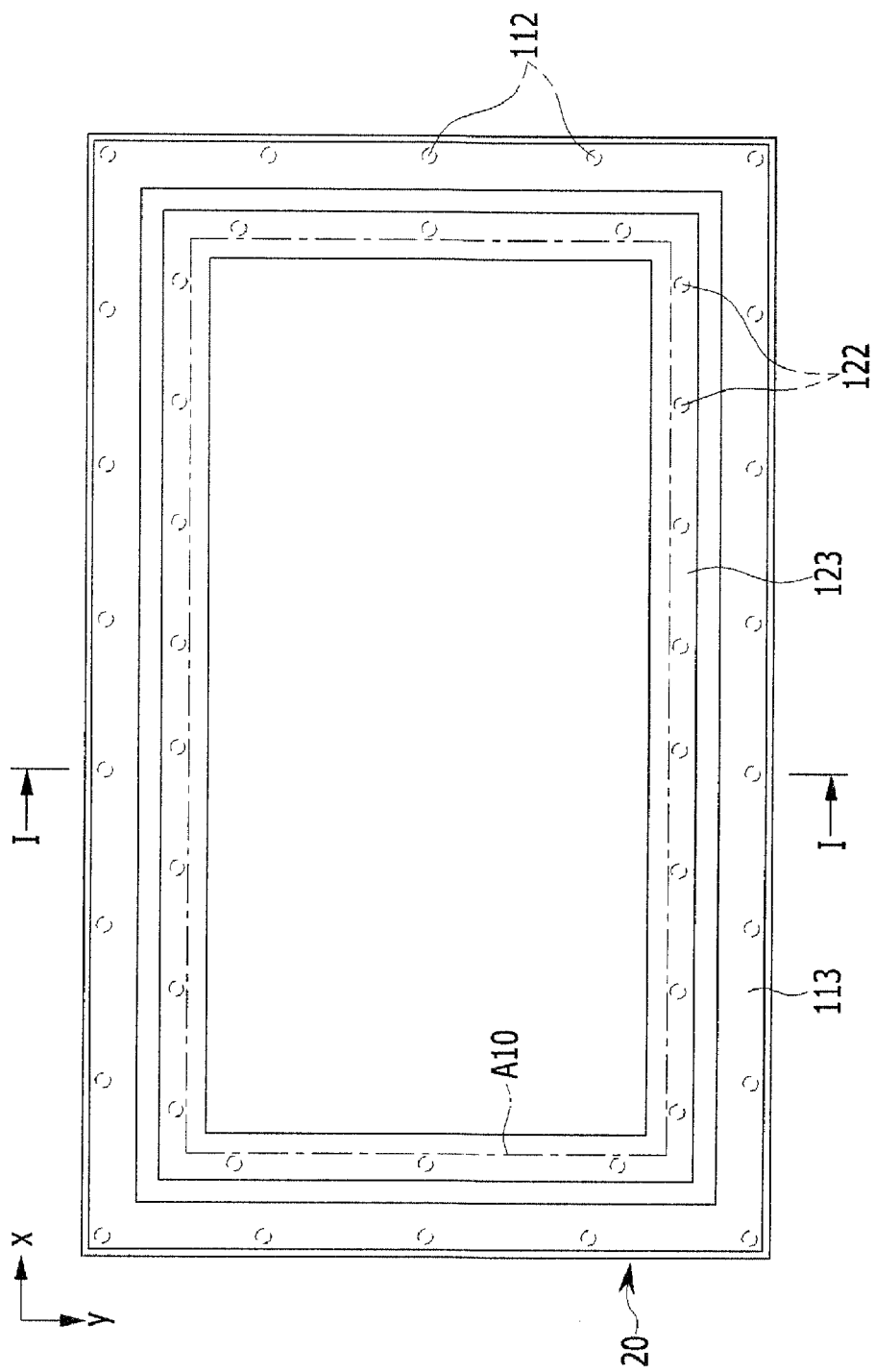
FIG. 4 is a top plan view of an outer side of the sealing substrate of the OLED display device of FIG. 1.

FIG. 3 and FIG. 4 are top plan views illustrating inner and outer sides of the sealing substrate of the OLED display device of FIG. 1.

Referring to FIG. 1 to FIG. 5, the sealing substrate 20 is formed of a size that covers the display area A10 and the four wire and sealing areas A20. Thus, the pad area A30 of the substrate 10 is exposed to the outside rather than being overlapped with the pad area A30.

The sealing substrate 20 forms a first through hole 21 for applying an electric signal of the common power line 41 and a second through hole 22 for applying an electric signal of the common electrode 42. In addition, a first conductive portion 110 is formed through the inner side of the sealing substrate 20, the first through hole 21, and the outer side of the sealing substrate 20, and a second conductive portion 120 is formed through the inner side of the sealing substrate 20, the second through hole 22, and the outer side of the sealing substrate 20.

The first conductive portion 110 includes a first inner layer 111 formed in the inner side of the sealing substrate 20, a first connection portion 112 filled in the first through hole 21 while contacting the first inner layer 111, and a first outer layer 113 formed in the outer side of the sealing substrate 20 while contacting the first connection portion 112.

The second conductive portion 120 includes a second inner layer 121 formed in the inner side of the sealing substrate 20, a second connection portion 122 filled in the second through hole 22 while contacting the second inner layer 121, and a second outer layer 123 formed in the outer side of the sealing substrate 20 while contacting the second connection portion 122.

The first conductive portion 110 and the second conductive portion 120 are formed of a conductive material, and are separated by a predetermined distance to prevent a short-circuit therebetween. That is, the first inner layer 111 and the second inner layer 121 are separated by a predetermined distance at the inner side of the sealing substrate 20, and the first outer layer 113 and the second outer layer 123 are also separated by a predetermined distance therebetween at the outer side of the sealing substrate 20.

The second inner layer 121 faces the entire area of the display area A10 and is formed of a size that is larger than the display area A10. The second connection portion 122 may be formed to contact the second inner layer 121 at the outer side of the display area A10. Various second through holes 22 and various second connection portions 122 may be provided along the edge of the second inner layer 121, with a predetermined separation distance between each pair.

The first inner layer 111 is located at the outer side of the second inner layer 121, and faces the pad unit 32 formed on the substrate 10. The first inner layer 111 may extend to the edge of the sealing substrate 20 to contact the adhering layer 31. The first inner layer 111 may have a rectangular shape that wholly surrounds the second inner layer 121, or may be divided into a plurality of pieces separated from each other by a predetermined distance.

FIG. 3 illustrates that the first inner layer 111 has the shape of the rectangular frame, but the shape of the first inner layer 111 is not limited thereto. Various first penetration or through holes 21 and various first connection portions 112 are provided separated by a predetermined distance between each other along a length direction of the first inner layer 111.

The first inner layer 111 and the second inner layer 121 are formed of a metal film having low resistance and have excellent moisture and oxygen capturing properties. For example, the first inner layer 111 and the second inner layer 121 may be formed of an aluminum film, an aluminum alloy film, a copper film, or a copper alloy film. In addition, the first inner layer 111 and the second inner layer 121 may be formed of a metal film including aluminum or copper. The metal foil is attached to the inner side of the sealing substrate 20.

The first inner layer 111 and the second inner layer 121 are attached to the adhering layer 31 and capture external moisture and oxygen toward the display unit 40 by covering the entire display area A20. Thus, the first and second inner layers 111 and 121 in the OLED display device 100 function as a metal encapsulation that seals the display unit 40.

The first outer layer 113 is formed at the four edges of the sealing substrate 20, and the second outer layer 123 may be located at the inner side of each of the first outer layers 113. The first outer layer 113 and the second outer layer 123 may have the shape of the rectangular frame.

Additional access terminals are attached to the first outer layers 113 and the second outer layers 123. Thus, the first outer layer 113 receives a first electric signal of the common power line 41 from the external access terminal and transmits the signal to the first inner layer 111, and the second outer layer 123 receives a second electric signal from the external access terminal and transmits the signal to the second inner layer 121.

The first outer layer 113 is thicker than the first inner layer 111, and the second outer layer 123 may be thicker than the second inner layer 121. Then, a large-size OLED display device having a large current capacity can be formed without enlargement of the outer side of the display. In this case, the first inner layer 111 and the second inner layer 121 have the same thickness and the first outer layer 113 and the second outer layer 123 have the same thickness to prevent a stepped portion from being formed through the sealing process of the substrate 10 and the sealing substrate 20.

The OLED display device 100, and the sealing substrate 20 is formed of a carbon composite material including a resin and a plurality of carbon fibers. The substrate 10 of the OLED display device 100 needs to experience several heat treatments for forming the driving circuit and the organic light emitting element on the substrate 10 so that glass or a polymer resin having a low thermal expansion coefficient is used. The sealing substrate 20 may have a thermal expansion coefficient that is almost similar to that of the substrate 10 by controlling the content of the carbon fiber and the content of the resin.

Thus, when the substrate 10 and the sealing substrate 20 are sealed to each other by hardening the adhering layer 31 at high temperature, torsion of the two substrates 10 and 20 due to the thermal expansion coefficient difference therebetween does not occur, and a bending problem does not occur in the environment reliability test after the sealing.

Figure 5:
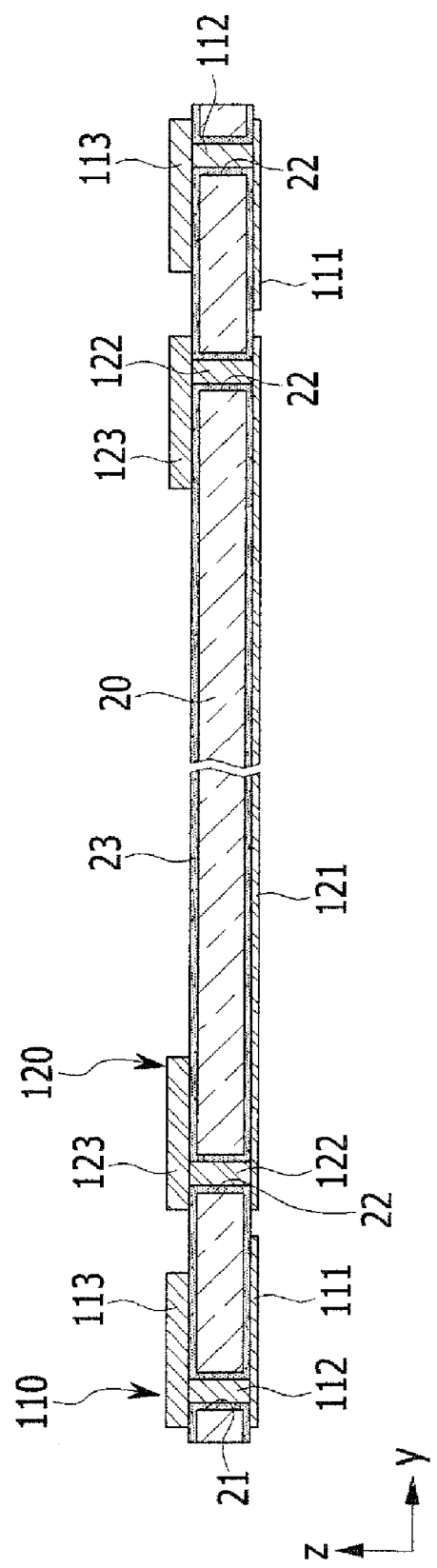
FIG. 5 is a cross-sectional view of FIG. 4, taken along the line I-I.

The sealing substrate 20 formed of the carbon composite material has conductivity. When the first and second conductive portions 110 and 120 are directly formed on the surface of the sealing substrate 20, the first conductive portion 110 and the second conductive portion 120 are short-circuited through the sealing substrate 20. Thus, as shown in FIG. 5, insulating films 23 are formed at the inner and outer sides of the sealing substrate 20, the side surface of the first through hole 21, and the side surface of the second through hole 22 to prevent a short-circuit between the first conductive portion 110 and the second conductive portion 120. A detailed structure and constituents of the sealing substrate 20 will be described later.

Referring to FIG. 1, a conductive protruding portion 35 that is electrically connected with the pad 32 is formed on the pad 32 of the substrate 10. In addition, the common electrode 42 formed in the display unit 40 forms a plurality of protruding portions 421. During the pressing process of the substrate 10 and the sealing substrate 20, the conductive protruding portion 35 is attached to the first inner layer 111 to conduct the first inner layer 111 and the common power line 41. The second inner layer 121 is attached to the protruding portions 421 of the common electrode 42 and thus electrically connected with the common electrode 42.

In this case, when the display unit 40 is formed, the conductive protruding portion 35 may be formed simultaneously of the same material as the display unit 40. That is, the conductive protruding portion 35 may be formed together with the display unit 40 with the constituents of the display unit 40 when forming the display unit 40 rather than forming the conductive protruding portion 35 with an additional patterning process after forming the display unit 40. A detailed structure of the conductive protruding portion 35 will be described later with reference to FIG. 6 and FIG. 7.

As described, since the OLED display device 100 is provided with the conductive protruding portion 35, an additional conductive adhering layer forming process for connecting the first conductive portion 110 and the common power line 41 may be omitted. The conductive adhering layer is an adhering layer having conductivity by adding a conductive material to a typical adhering layer and is used in a display device, and may be applied to connect the pad and the first conductive portion.

However, since an epoxy-type conductive adhering layer is hardened at a temperature over 150° C., the display unit may be damaged during the hardening process so that the epoxy-type conductive adhering layer cannot be applied to the OLED display device. Thus, a new material for the conductive adhering layer should be developed. In addition, in the case of using the conductive adhering layer 31, the conductive adhering layer 31 should be isolated from the display unit 40 and the external side of the device by arranging adhering layers (insulative adhering layer) at inner and outer sides of the conductive adhering layer.

The OLED display device 100 is provided with the conductive protruding portion 35 rather than having the conductive adhering layer so that the entire structure and the manufacturing process can be simplified. Further, the corresponding electric signal can be evenly applied to the common power line 41 and the common electrode 42 using the first conductive portion 110 and the second conductive portion 120 without forming the pad area A30 at the four edges (up, down, left, and right) of the substrate 10, while realizing a large-sized display unit 40. As a result, the entire structure and the manufacturing process can be simplified while preventing luminance non-uniformity of the large-sized display unit 40.

Figure 6:
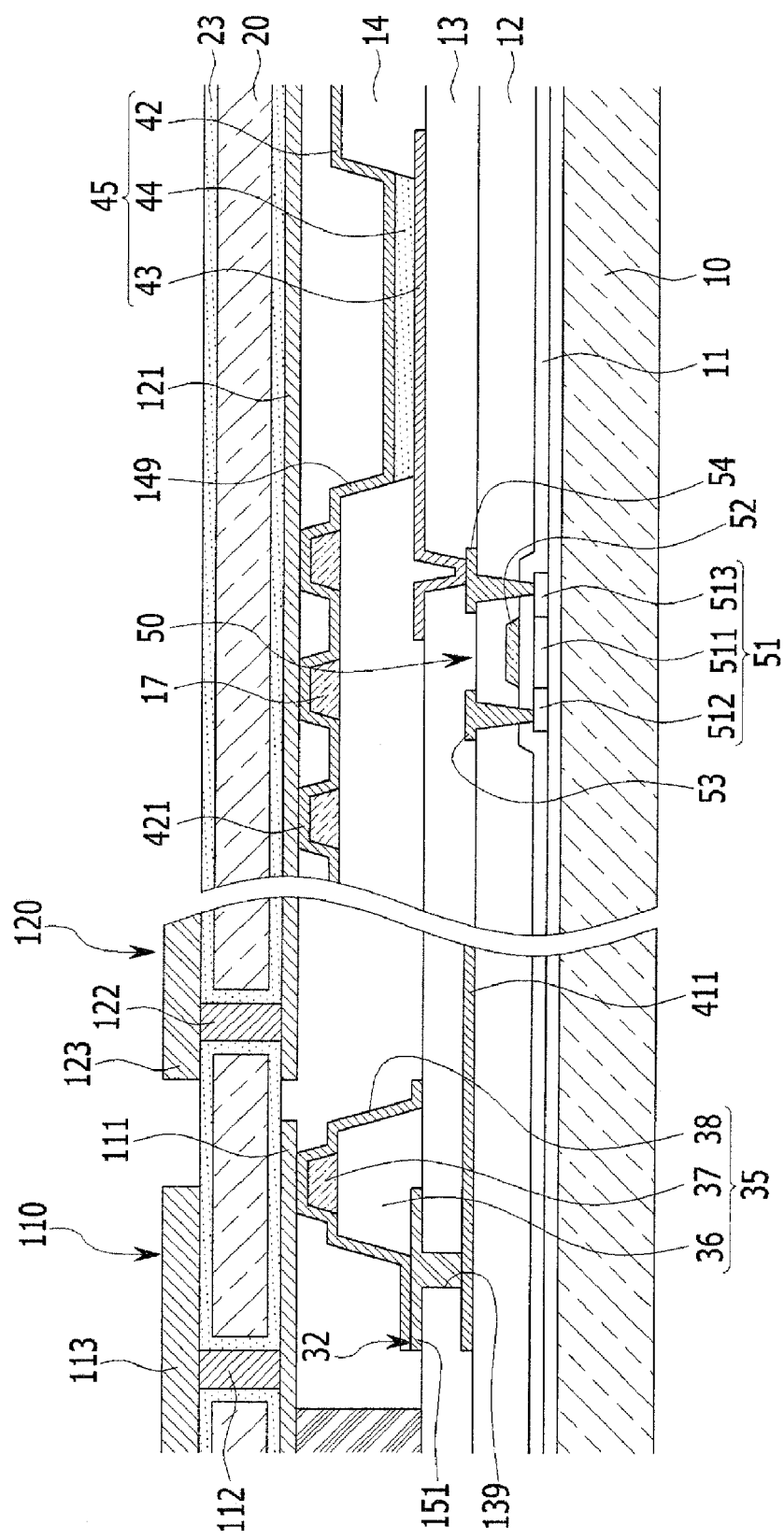
FIG. 6 and FIG. 7 are partially enlarged cross-sectional views of the OLED display device according to an embodiment of the present invention.
Figure 7:
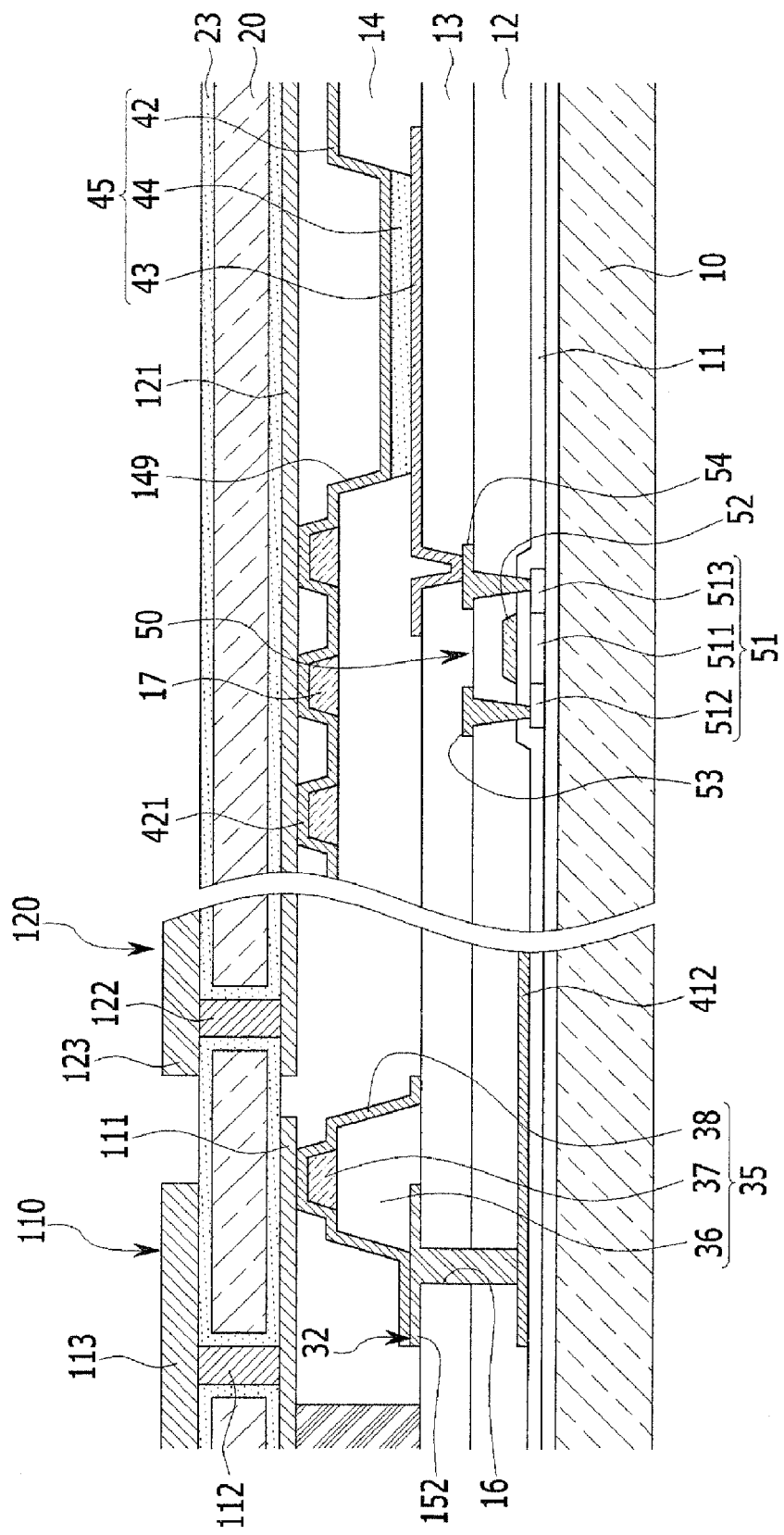

FIG. 6 and FIG. 7 are partially enlarged cross-sectional views of the OLED display device according to another exemplary embodiment of the present invention. FIG. 6 illustrates the first common power line 411 and the pad 32 in detail, and FIG. 7 illustrates the second common power line 412 and the pad 32 in detail.

Referring to FIG. 6 and FIG. 7, the organic light emitting element 45 and the driving circuit are formed in each pixel of the display unit. The driving circuit is formed of at least two thin film transistors and at least one capacitor. In FIG. 6 and FIG. 7, one thin film transistor 50 and one organic light emitting element 45 are disposed in the display unit.

The thin film transistor 50 includes a semiconductor layer 51, a gate electrode 52, a source electrode 53, and a drain electrode 54. The semiconductor layer 51 is formed of a polycrystalline silicon layer, and includes a channel area 511, a source area 512, and a drain area 513. The channel area 511 is an intrinsic semiconductor not doped with an impurity, and the source area 512 and the drain area 513 are impurity-doped impurity semiconductors.

The gate electrode 52 is disposed on the channel area 511 of the semiconductor layer 51, interposing the gate insulating layer 11 therebetween. The source electrode 53 and the drain electrode 54 are disposed on the gate electrode 52, interposing an interlayer insulating layer 12 therebetween, and respectively connected with the source area 512 and the drain area 513 through a contact hole formed in the interlayer insulating layer 12. A planarization layer 13 is formed on the source electrode 53 and the drain electrode 54, and a pixel electrode 43 is formed on the planarization layer 13. The pixel electrode 43 is connected with the drain electrode 54 through a contact hole formed on the planarization layer 13.

A pixel definition layer 14 is formed on the pixel electrode 43 and the planarization layer 13. The pixel definition layer 14 partially exposes the pixel electrode 43 by forming an opening 141 in each pixel. An organic emission layer 44 is formed on the exposed pixel electrode 43. The common electrode 42 is formed in the entire area of the display unit 40 to cover the organic emission layer 44 and the pixel definition layer 14. The pixel electrode 43, the organic emission layer 44, and the common electrode 42 form the organic light emitting element 45.

The pixel electrode 43 may be a hole injection electrode and the common electrode 42 may be an electron injection electrode. In this case, the organic emission layer 44 is formed of a hole injection layer (HIL), a hole transport layer (HTL), an emission layer, an electron transport layer (ETL), and an electron injection layer (EIL) that are sequentially stacked from the pixel electrode 43. Holes and electrons are injected to the organic emission layer 44 from the pixel electrode 43 and the common electrode 42, and emission of light from the organic emission layer 44 is made when the excitons, being the combinations of the injected holes and electrodes, drop from the excited state to the ground state.

The pixel electrode 43 is formed as a transflective conductive layer and the common electrode 42 is formed as a reflective conductive layer. Light emitted from the organic emission layer 44 is reflected by the common electrode 42 and then emitted to the outside through the substrate 10. Such a light emission structure is called a rear light emission type. The pixel electrode 43 may be formed of a triple-layered film of ITO/silver (Ag)/ITO, and the common electrode 42 may include one of silver (Ag), aluminum (Al), a silver alloy, and an aluminum alloy.

The first common power line 411 and the second common power line 412 may be formed on the same layer of one of the gate electrode 52, the source electrode 53, and the drain electrode 54. FIG. 6 illustrates the first common power line 411 being formed on the same layer of the source and drain electrodes 53 and 54 and of the same material, and FIG. 7 illustrates that the second common power line 412 being formed on the same layer of the gate electrode 52 and of the same material.

End portions of the first common power line 411 and the second common power line 412 are extended to the wire and sealing area A20 at the outer side of the display unit 40. In addition, at least one insulating layer among four insulating layers formed in the display unit 40 may be extended to the wire and sealing area A20. The end portion of the first common power line 411 may be covered by the planarization layer 13, and the end portion of the second common power line 412 may be covered by the interlayer insulating layer 12 and the planarization layer 13.

The planarization layer 13 forms a second opening 139 to expose the end portion of the first common power line 411, and a first pad conductive layer 151 is formed on the planarization layer 13 and electrically connected to the first common power line 411 through the second opening 139. The pad 35 disposed in the long side of the substrate 10 may be defined as the first pad conductive layer 151.

The interlayer insulating layer 12 and planarization layer 13 form a third opening 16 to expose an end portion of the second common power line 412, and a second pad conductive layer 152 is formed on the planarization layer 13 and electrically connected with the second common power line 412 through the third opening 16. The pad 32 disposed at the short side of the substrate 10 may be defined as the second pad conductive layer 152.

The first pad conductive layer 151 and the second pad conductive layer 152 may be formed on the same layer of the pixel electrode 43 and of the same material. Then, the first and second pad conductive layers 151 and 152 and the pixel electrode 43 can be formed simultaneously so that the manufacturing process can be simplified.

In the display unit 40, the common electrode 42 forms a plurality of protruding portions 421, and the protruding portions 421 contact a second inner layer 121 formed in the sealing substrate 20. Thus, the common electrode 42 is directly connected with the second conductive portion 120 and receives a second electric signal therefrom. The protruding portions 421 of the common electrode 42 may be formed by a spacer 17. For example, a plurality of spacers 17 are formed on a pixel definition layer 14, and the common electrode 42 may be formed in the entire area of the display unit 40 while coving the spacers. The spacers 17 are disposed on the pixel definition layer 14 where the organic emission layer 44 is not formed.

The conductive protruding portion 35 is formed on the first pad conductive layer 151 and the second pad conductive layer 152, and the conductive protruding portion 35 is attached to the first inner layer 111. Thus, the first common power line 411 is connected with the first conductive portion 110 through the conductive protruding portion 35 and the first pad conductive layer 151 and receives the first electric signal therefrom. In addition, the second common power line 412 is connected with the first conductive portion 110 through the conductive protruding portion 35 and the second pad conductive layer 152 and receives the first electric signal therefrom.

The conductive protruding portion 35 is formed of a first insulating portion 36 partially covering the first or second pad conductive layers 151 and 152, a second insulating portion 37 formed on the first insulating portion 36, and a contact inductive layer 38 contacting the first conductive layer 151 or the second pad conductive layer 152 and the first inner layer 111. The conductive protruding portion is formed on the first and second insulating portions 36 and 37.

In this case, the first insulating portion 36 may be formed on the same layer as the pixel definition layer 14 and of the same material, and the second insulating unit 37 may be formed on the same layer of the spacers 17 of the same material. In addition, the contact conductive layer 38 may be formed on the same layer as the common electrode 42 and with the same material. Then, the display unit 40 and the conductive protruding portion 35 can be formed simultaneously so as to simplify the manufacturing process. The conductive protruding portion 35 is separated from the common electrode 42 of the display unit 40 by a predetermined distance in order to prevent a short-circuit therebetween.

In the above-described OLED display device 100, the substrate 10 may be formed of a transparent glass or a transparent plastic. The substrate 10 made of a transparent plastic material may include at least one of polyether sulfone, polyacrylate, polyether imide, polyethylene naphthalate, polyethylene terephthalate, poly phenylene sulfide, polyarylate, polyimide, polycarbonate, cellulose triacetate, and cellulose acetate propionate.

Since several processes are performed on the substrate 10 for forming the plurality of pixels and heat is applied thereto through the processes, the substrate 10 expands due to the heat. The expansion of the substrate 10 reduces durability and precision of the OLED display device 100, and therefore a material having a low thermal expansion coefficient is selected as a material of the substrate 10. The substrate 10 formed with glass or plastic and has a thermal expansion coefficient between about $3\times10\text{-}6/\text{K}$ to $4\times10\text{-}6/\text{K}$.

Figure 8:
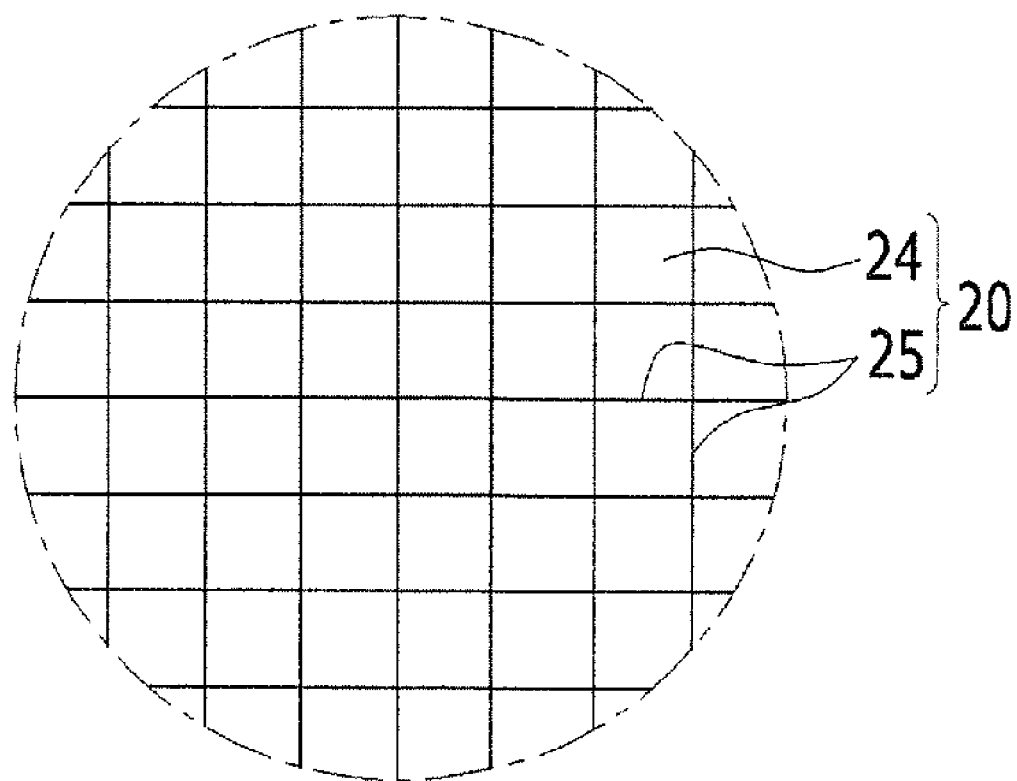
FIG. 8 is a partially enlarged top plan view of the sealing substrate of the OLED display device of FIG. 1.

FIG. 8 is a partially enlarged top plan view of the sealing substrate in the OLED display device of FIG. 1. Referring to FIG. 8, the sealing substrate 20 is formed of a carbon composite material including a resin 24 and a plurality of carbon fibers 25. The sealing substrate 20 may have a structure in which the plurality of carbon fibers 25 are saturated on the resin 24.

The carbon fiber 25 has a lower thermal expansion coefficient than the substrate 10. Particularly, the thermal expansion coefficient of the carbon fiber 25 in a length direction has a negative (−) value. The resin 24 has a higher thermal expansion coefficient than the substrate 10. Thus, the thermal expansion coefficient of the sealing substrate 20 can be controlled by controlling the amount of carbon fibers 25 and the amount of resin 24.

That is, when manufacturing the sealing substrate 20 by mixing the carbon fibers 25 and the resin 24, the thermal expansion coefficient of the sealing substrate 20 can be controlled to be equivalent or similar to that of the substrate 10 by controlling a ratio of the resin 24 and the carbon fibers 25.

The carbon fibers 25 do not absorb moisture so that they increase waterproof ability of the sealing substrate 20. Further, since the sealing substrate 20 including the carbon fiber 25 has excellent mechanical properties, it is possible to achieve large mechanical rigidity even with a small thickness. Therefore, the entire thickness of the OLE display 100 can be reduced. In addition, the sealing substrate 20 suppresses thermal expansion of the first and second conductive layers 111 and 121.

The plurality of carbon fibers 25 are arranged to cross each other, and, for example, may be woven with wefts and wraps. FIG. 8 illustrates that the carbon fibers 25 perpendicularly cross each other, but the aspects of the present invention are not limited thereto. Thus, the carbon fibers 25 may cross each other at predetermined angles other than the right angle. According to the configuration described above, the sealing substrate 20 can have a low thermal expansion coefficient throughout the region and the durability of the sealing substrate 20 can be increased.

Figure 9:
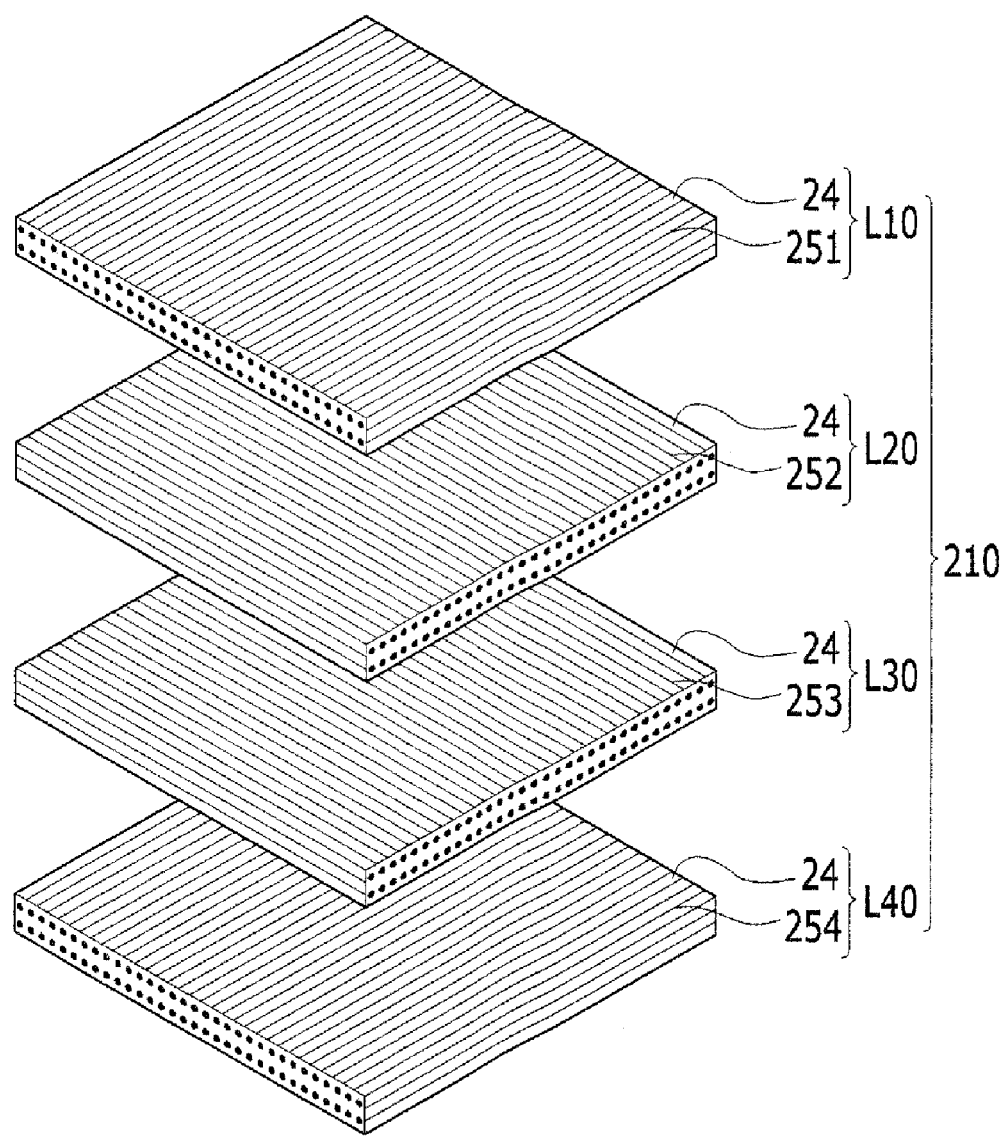
FIG. 9 is an exploded perspective view of the sealing substrate of the OLED display device of FIG. 1, as an exemplary variation of FIG. 8.

FIG. 9 is an exploded perspective view of the sealing substrate in the OLED display device of FIG. 1, as an exemplary variation of FIG. 8. Referring to FIG. 9, a sealing substrate 210 is formed of a plurality of layers. For example, the sealing substrate 210 may have a layered structure in which a first layer L10, a second layer L20, a third layer L30, and a fourth layer L40 are layered. However, aspects of the present invention are not limited thereto, and the sealing substrate 210 can have more or less layers. Each of the respective layers L10, L20, L30, and L40 includes a resin 24 and a plurality of carbon fibers 251, 252, 253, and 254.

The carbon fibers 251 and 254 of the first and fourth layers L10 and L40 may be arranged along a first direction, and the carbon fibers 252 and 253 of the second and third layers L20 and L30 may be arranged along a second direction. The first direction and the second direction may or may not be perpendicular to each other. FIG. 9, for example, illustrates that the first direction and the second direction are perpendicular to each other.

The first layer L10 to the fourth layer L40 form a single sealing substrate 210 by the resin 24 integrally hardened by press-baking. When the plurality of carbon fibers 251, 252, 253, and 254 are arranged as described above, torsion of the sealing substrate 210 can be prevented, thereby increasing planarity of the sealing substrate 210.

In order to control a thermal expansion coefficient of the sealing substrate 210, the arrangement direction of the carbon fibers 251 and 254 of the first and fourth layers L10 and L40 and the arrangement direction of the carbon fibers 252 and 253 of the second and third layers L20 and L30 can be variously set. A thermal expansion coefficient of each of the respective layers L10, L20, L30, and L40 can be easily controlled by controlling the amount of resin 24 and the amount of carbon fibers 251, 252, 253, and 254 included in the respective layers L10, L20, L30, and L40.

Figure 10:
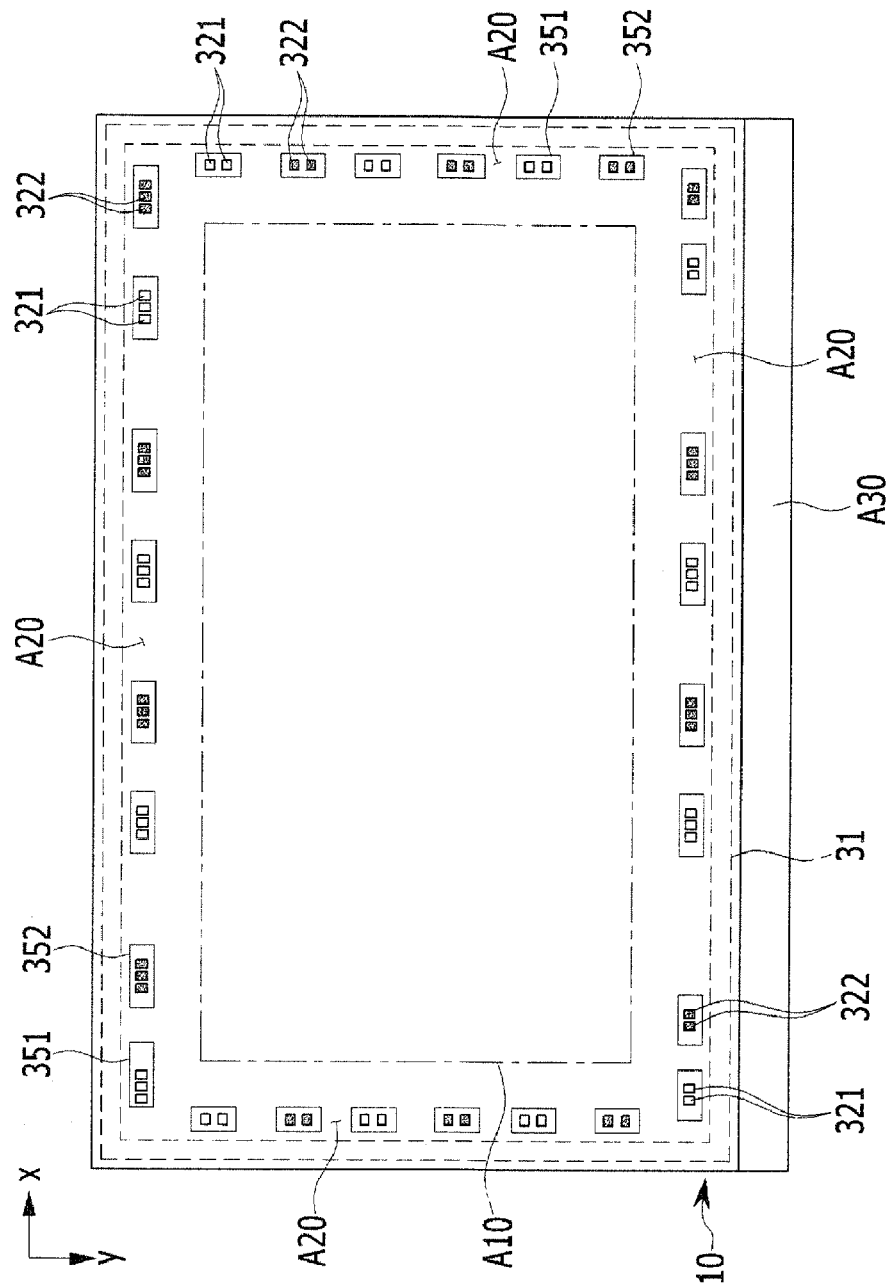
FIG. 10 is a top plan view of a substrate of an OLED display device according to another embodiment of the present invention.
Figure 11:
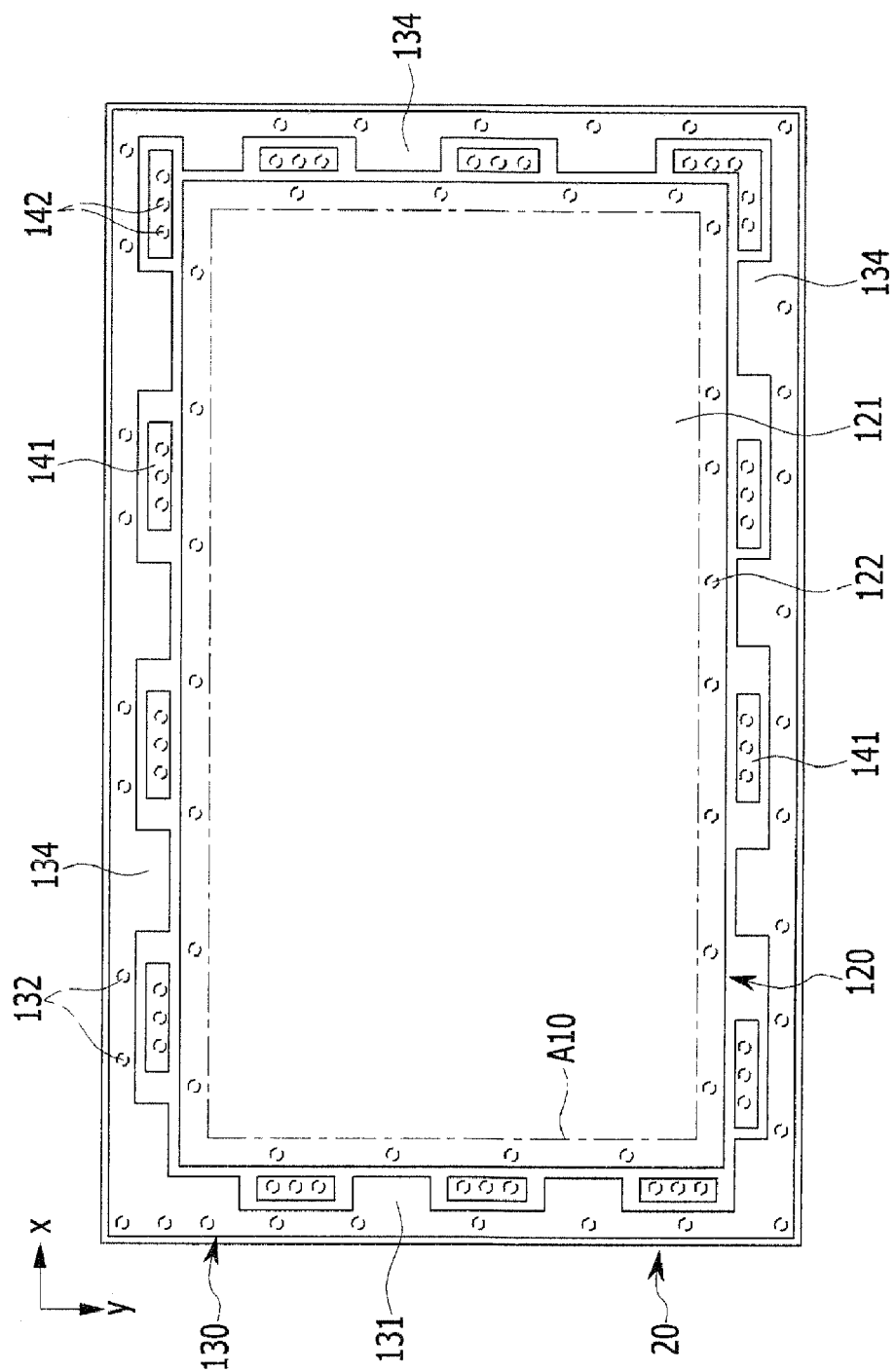
FIG. 11 is a top plan view of an inner side of a sealing substrate of the OLED display device according to another embodiment of the present invention.
Figure 12:
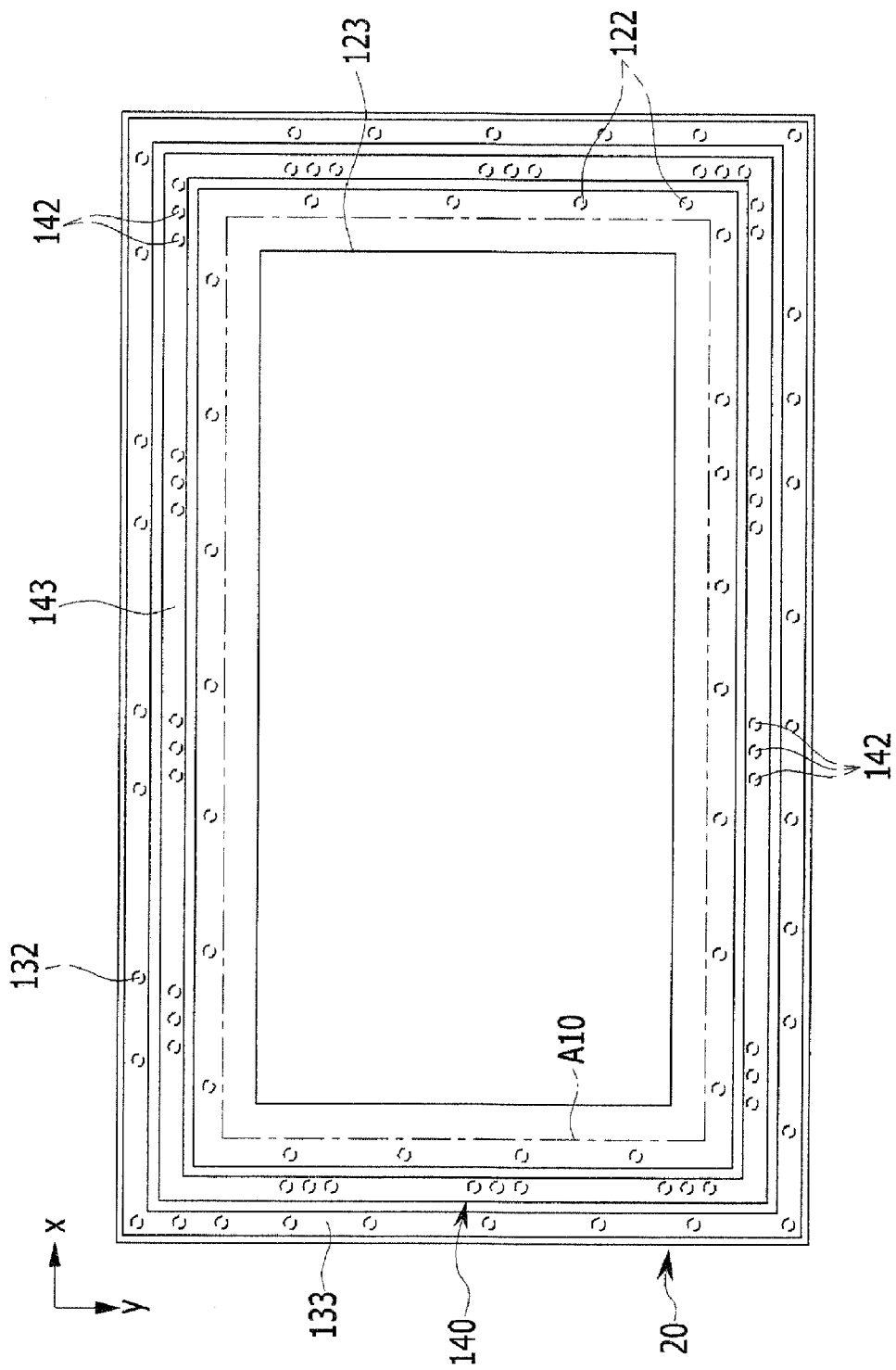
FIG. 12 is a top plan view of an outer side of the sealing substrate of the OLED display device according to another embodiment of the present invention.

FIG. 10 is a top plan view of a substrate of an OLED display device according to another embodiment, and FIG. 11 and FIG. 12 are top plan views respectively illustrating an inner side and an outer side of a sealing substrate of the OLED display device of the other embodiment.

Referring to FIG. 10, a first common power line is divided into an odd-numbered first common power line and an even-numbered first common power line, and a second common power line is divided into an odd-numbered second power line and an even-numbered second power line. The odd-numbered first common power line and the odd-numbered second common power line receive a third electric signal, and the even-numbered first common power line and the even-numbered second common power line receive a fourth electric signal. Such a structure is provided for interlace scanning driving.

A pad for the common power lines formed in the substrate 10 includes a first pad 321 for the odd-numbered first common power line and the odd-numbered second common power line and a second pad 322 for the even-numbered first common power line and the even-numbered second common power line. The first pad 321 and the second pad 322 may be alternately arranged along horizontal and vertical directions of the substrate 10, and the alternate arrangement is iterative.

In FIG. 10, the second pad 322 is dot-patterned in order to distinguish the first pad 321 and the second pad 322. FIG. 10 schematically illustrates the first pad 321 and the second pad 322, and the location and the number of first and second pads are not limited thereto.

The first pad 321 and the second pad 322 are formed of at least one of the first pad conductive layer 151 and the second pad conductive layer 152 shown in FIG. 6 and FIG. 7. In addition, a first conductive protruding portion 351 is formed on the first pad 321 such that first conductive protruding portion 351 is electrically connected with the first pad 321, and a second conductive protruding portion 352 is formed on the second pad 322 such that the second conductive protruding portion is electrically connected with the second pad 322.

FIG. 10 schematically shows locations of the first and second conductive protruding portions 351 and 352. The shape of the first and second conductive protruding portions 351 and 352 are the same as that of the conductive protruding portion 35 shown in FIG. 6 and FIG. 7.

Referring to FIG. 11 and FIG. 12, a first conductive portion includes a third conductive portion 130 applying a third electric signal to the odd-numbered first common power line and the odd-numbered second common power line and a fourth conductive portion 140 applying a fourth electric signal to the even-numbered common power line and the even-numbered second common power line. The sealing substrate 20 forms a third through hole for the third conductive portion 130 and a fourth through hole for the fourth conductive portion 140.

The third conductive portion 130 includes a third inner layer 131 disposed in an inner side of the sealing substrate 20, a third connection portion 132 filled in the third through hole while contacting the third inner layer 131, and a third outer layer 133 disposed at an outer side of the sealing substrate 20 while contacting the third connection portion 132. The fourth conductive portion 140 includes a fourth inner layer 141 disposed in an inner side of the sealing substrate 20, a fourth connection portion filled in the fourth through hole while contacting the fourth inner layer 141, and a fourth outer layer 143 disposed in the outer side of the sealing substrate 20 while contacting the fourth connection portion 142.

The second inner layer 121 and the third inner layer 131 maintain a distance therebetween in the inner side of the sealing substrate 20. The second outer layer 123, the third outer layer 133, and the fourth outer layer 143 maintain a distance therebetween in the outer side of the sealing substrate 20. In this case, an insulating layer (not shown) is disposed at the inner and outer sides of the sealing substrate 20 and sidewalls of the second and fourth through holes, and the second, third, and fourth conductive portions 120, 130, and 130 are disposed on the insulating layer.

The second inner layer 121 faces the entire area of the display area A10 and is larger than the display area A10. The third and fourth inner layers 131 and 141 are disposed at the outer side of the second inner layer 121. The third inner layer 131 may be provided at four edges of the sealing substrate 20, and may form a plurality of extension portions 134 overlapping the first pads 321 and contacting the first conductive portions 351. The first inner layer 141 overlaps the second pads 322 and contacts the second conductive protruding portions 352.

The third outer layer 133 may be provided at four edges of the sealing substrate 20 and the fourth outer layer 143 may be disposed in parallel with the third outer layer 133 at the inner side of the third outer layer 133. The third outer layer 133 may be thicker than the third inner layer 131, and the fourth outer layer 143 may be thicker than the fourth inner layer 141. In this case, a large-sized OLED having a large current capacity can be formed.

The third conductive portion 130 applies the third electric signal to the odd-numbered first and second common power lines through the first conductive protruding portion 351 and the first pad 321. The fourth conductive portion 140 applies the fourth electric signal to the even-numbered first and second common power lines through the second conductive protruding portion 352 and the second pad 322.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a display unit disposed on the substrate and including an electrode;
   a conductive protruding portion disposed at an outer side of the display unit and electrically connected with the electrode;
   a sealing substrate fixed to the substrate by an adhering layer surrounding the display unit and the conductive protruding portion, the sealing substrate including a resin and a plurality of carbon fibers disposed in form of a matrix, and including a through hole;
   a metal layer disposed at one side of the sealing substrate, facing the substrate, and contacting the conductive protruding portion and electrically connected with the electrode; and
   a conductive connection portion filling the through hole and contacting the metal layer.

2. The display device of claim 1, wherein the plurality of carbon fibers cross each other and are impregnated with the resin.

3. The display device of claim 1, wherein the sealing substrate is formed of a plurality of layers, each layer including the plurality of carbon fibers impregnated with resin, wherein the carbon fibers of at least two of the plurality of layers extend in different directions.

4. The display device of claim 1, wherein the conductive protruding portion is simultaneously formed with the display unit and the conductive protruding portion is of a same material as the display unit.

5. The display device of claim 4, wherein the display unit comprises an organic light emitting element, and the electrode is a common power line.

6. The display device of claim 5, wherein the display unit further comprises a common electrode including a plurality of protruding portions, and the metal layer is divided into a first meal layer attached to the conductive protruding portion and a second metal layer attached to the plurality of protruding portions.

7. An organic light emitting diode (OLED) display device comprising:
   a substrate;
   a display unit disposed on the substrate and including a common power line and a common electrode;
   a sealing substrate fixed to the substrate by an adhering layer surrounding the display unit, the sealing substrate including a resin and a plurality of carbon fibers, and having a first through hole and a second through hole;
   a conductive protruding portion disposed along an outer side of the display unit and connected with the common power line;
   a first conductive portion formed on inner and outer sides of the sealing substrate through it the first through hole, and attached to the conductive protruding portion to supply a first electric signal to the common power line; and
   a second conductive portion formed on the inner and outer sides of the sealing substrate through the second through hole, and attached to the common electrode to apply a second electric signal to the common electrode.

8. The OLED display device of claim 7, further comprising a plurality of pads disposed at the outer side of the display unit and connected to the common power line,
   wherein the conductive protruding portion is disposed on and contacts the pads.

9. The OLED display device of claim 8, wherein the conductive protruding portion comprises a first insulating portion partially covering the pads, a second insulating portion formed on the first insulating portion, and an access conductive layer formed on the first and second insulating portions, while contacting the pads.

10. The OLED display device of claim 9, wherein the common electrode comprises a plurality of protruding portions, and the second conductive portion contacts the plurality of protruding portions.

11. The OLED display device of claim 10, further comprising a plurality of spacers disposed at a lower portion of the common electrode, wherein the plurality of protruding portions are respectively formed on the spacers.

12. The OLED display device of claim 11, wherein the display unit further comprises a pixel definition layer, the first insulating portion is formed of a same material as the pixel definition layer, the second insulating layer is formed of a same material as the spacer, and the access conductive layer is formed of a same material as the common electrode.

13. The OLED display device of claim 12, wherein the conductive protruding portion is disposed at a predetermined distance from the common electrode on the display unit.

14. The OLED display device of claim 7, further comprising an insulating layer formed on inner and outer sides of the sealing substrate and on side walls of the first and second through holes,
  wherein the first and second conductive portions are disposed on the insulating layer.

15. The OLED display device of claim 14, wherein the second conductive portion comprises a second inner layer facing the display unit, the second conductive portion being larger than the display device, and the first conductive portion comprises a first inner layer disposed at an outer side of the second inner layer and contacting the sealing substrate.

16. The OLED display device of claim 15, wherein the first inner layer and the second inner layer include at least one of an aluminum layer, an aluminum alloy layer, a copper layer, and a copper alloy layer.

17. The OLED display device of claim 15, wherein the first conductive portion further comprises a first connection portion filled in the first through hole and a first outer layer disposed at the outer side of the sealing substrate, and the second conductive portion further comprises a second connection portion filled in the second through hole and a second outer layer disposed at the outer side of the sealing substrate.

18. The OLED display device of claim 17, wherein the second through hole and the second connection portion are disposed at the outer side of the display unit.

19. The OLED display device of claim 17, wherein the first outer layer is disposed along four edges of the sealing substrate, and the second outer layer is disposed parallel to the first outer layer along the inner side of the first outer layer.

20. The OLED display device of claim 17, wherein the first outer layer is thicker than the first inner layer, and the second outer layer is thicker than the second inner layer.

21. The OLED display device of claim 7, wherein the common power line comprises a first common power line and a second common power line that cross each other.

22. The OLED display device of claim 21, wherein the first conductive portion comprises a third conductive portion connected with an odd-numbered first common power line and an odd-numbered second common power line among the first and second common power lines to supply a third electric signal thereto, and a fourth conductive portion connected with an even-numbered common power line and an even-numbered second common power line to supply a fourth electric signal thereto.

23. The OLED display device of claim 22, further comprising a first pad disposed at an outer side of the display unit and electrically connected to an odd-numbered first common power line and electrically connected to an odd-numbered second common power line and a second pad electrically connected with an even-numbered first common power line and electrically connected to an even-numbered second common power line.

24. The OLED display device of claim 23, wherein the conductive protruding portion comprises a first conductive protruding portion disposed on the first pad while contacting the first pad and a second conductive protruding portion disposed on the second pad while contacting the second pad.

25. The OLED display device of claim 24, wherein the third conductive portion comprises a third inner layer attached to the first conductive protruding portion, and the fourth conductive portion comprises a fourth inner layer attached to the second conductive protruding portion.

\* \* \* \* \*